(12) United States Patent
Noh et al.

(10) Patent No.: US 6,413,796 B1
(45) Date of Patent: Jul. 2, 2002

(54) TAPE FOR SEMICONDUCTOR PACKAGE, METHOD OF MANUFACTURING THE SAME, AND METHOD OF MANUFACTURING THE PACKAGE USING THE TAPE

(76) Inventors: Kil Seob Noh, Mujigae Apt. 5-106, 487-1, Bangbae-Dong, Socho-Gu; Kee Hwan Nam, Joogong Apt. 429-103, 189-1, Gaepho-Dong, Gangnam-Gu, both of Seoul (KR)

( * ) Notice: Subject to any disclaimer, the term of this patent is extended or adjusted under 35 U.S.C. 154(b) by 0 days.

(21) Appl. No.: 09/652,518

(22) Filed: Aug. 31, 2000

(51) Int. Cl.[7] .................. H01L 21/44; H01L 21/48; H01L 21/50
(52) U.S. Cl. .................. 438/108; 438/106; 438/127
(58) Field of Search ................ 438/118, 464, 438/460, 106, 127, 108

(56) References Cited

U.S. PATENT DOCUMENTS

| | | | | |
|---|---|---|---|---|
| 5,433,819 A | * | 7/1995 | McMeen | 216/20 |
| 5,727,310 A | * | 3/1998 | Casson et al. | 29/830 |
| 5,814,894 A | * | 9/1998 | Igarashi et al. | 257/787 |
| 5,932,345 A | * | 8/1999 | Furutani et al. | 428/364 |
| 5,960,260 A | * | 9/1999 | Umehara et al. | 438/118 |
| 6,097,081 A | * | 8/2000 | Masuda et al. | 257/666 |

* cited by examiner

Primary Examiner—Amir Zarabian
Assistant Examiner—Brad Smith
(74) Attorney, Agent, or Firm—Testa, Hurwitz & Thibeault, LLP

(57) ABSTRACT

The present invention relates to a tape for semiconductor package used to attach a chip and a lead frame or a chip and a substrate, method of manufacturing the same, and method of manufacturing the package using the tape. The tape of the present invention is manufactured by applying a release film at one side of a base film having a sheet type or a roll type, forming a plurality of alignment holes, at a given distance, along the edge of the base film by means of punching or etching process, for exact position alignment, and forming a thermoplastic pattern on the release film so that it can match to a lead frame or the portion to which a chip of a substrate is attached, by means of screen printing process using a mask. Also, the tape of the present invention can be used in manufacturing all the packages such as a package for attaching the chip to the lead frame as the package of a lead on chip (LOC) type, and the package for attaching the chip to the substrate as the chip scale package (CSP), etc. and can attach the thermoplastic pattern formed at the tape to a desired portion of a plurality of lead frames or a plurality of substrates simultaneously, by means of thermal press process. Thus, it can simplify the process of manufacturing the package, reduce the cost and improve the productivity.

3 Claims, 5 Drawing Sheets

Thermal Press

TAPE FOR SEMICONDUCTOR PACKAGE, METHOD OF MANUFACTURING THE SAME, AND METHOD OF MANUFACTURING THE PACKAGE USING THE TAPE

FIELD OF THE INVENTION

The invention relates generally to a tape for semiconductor package used to attach a chip and a lead frame or a chip and a substrate, method of manufacturing the same, and method of manufacturing the package using the tape, and more particularly to, a tape for semiconductor package, method of manufacturing the same, and method of manufacturing the package using the tape, in which a tape for semiconductor package of a sheet type or a roll type is formed in which a thermoplastic pattern matching to the lead frame or the portion to which the chip of the substrate is bonded, is provided, thus, reducing the cost and improving the productivity.

DESCRIPTION OF THE PRIOR ART

Generally, the semiconductor package includes various types of packages, such as the package in which chips are bonded to the lead frames like the package of lead on chip (LOC) type, the package in which chips are bonded to the substrate like a chip scale package (CSP), for example, a micro ball grid array ($\mu$BGA) package, etc. Recently, as electronic devices become miniaturized and thinner, it is required that the package also be miniaturized and thinner. Specially, in order to enhance the competitiveness between the manufacturing companies, it is required that the productivity be improved and the cost be reduced. As one way of improve the productivity and reduce the cost, a method of simplifying the process of manufacturing the package, has been proposed.

FIG. 1 is a sectional view of a conventional lead on chip type for attaching a chip to a lead frame. The lead on chip package 10 includes a chip 11, a lead frame 12, an attachment layer 13 for attaching the chip 11 and the lead frame 12, a wire 14 for electrically connecting the chip 11 and the lead frame 12, and a protective layer 15 for protecting the chip 11 and the wire 14 from outside various damage.

FIG. 2 is a sectional view of a conventional chip scale package for attaching a chip to a substrate. The chip scale package 20 includes a chip 21, a substrate 22, an attachment layer 23 for attaching the chip 21 and the substrate 22, a lead 24 for electrically connecting the chip 21 and the substrate 22, a protective layer 25 for protecting the chip 21 and the lead 24 from outside various damage, and a solder ball 26 formed below the substrate 22.

The basic manufacturing process of the lead on chip type package 10 and the chip scale package 20 sequentially includes a wafer dicing saw process of individually separating the chips 11, 21 from the wafer, a chip attachment process of attaching the chips 11, 21 to the lead frame 12 or the substrate 22, a wire/lead attachment process of electrically connecting the chips 11, 21 and the lead frame 12 or the substrate 22, a molding and sealing process of protecting the chips 11, 21 from various damage factors, thus completing a assembly process.

After the assembly process, the package of lead on chip type 10 is manufactured by sequentially performing a mechanical/chemical deflash process, a tin plating process, a trim process, a form/singulation process, a pretest process, a burn-in test process, a post test process, etc., so that individual devices can be separated from the lead frame strip consisted of lead frame units and their lead shapes can be formed into a prescribed shape, thus functioning as a complete integrated circuit (IC), after the above assembly process.

The chip scale package 20 is pasted with a solder flux, after the above mentioned assembly process, and is manufactured by sequentially performing a solder ball attachment process, a reflow process and a singulation process.

Among the above mentioned package manufacturing process, the attachment layers 13, 23 used in the chip attachment process for attaching the chip 11 and the lead frame 12 or the chip 21 and the substrate 22 are formed of tape slices 31 made by cutting the tape 30 of a conventional three-layer structure shown in FIG. 3 into a constant size, using a cutting tool. The three-layer structure 30 is formed of films 32 and 34 made of adhesives at the top and bottom sides of the base film 33. Meanwhile, the elastomer is an adhesive mainly used in the chip scale package 20 and is formed with a nubbin type, etc. Generally, though a method of using the tape of three-layer structure is widely used in the chip attachment process, as mentioned above, in the chip scale package, a method of attaching the chip by which the tape of a three-layer structure is attached, a coating solution is dropped or a screen-printing is applied to cure it, and adhesive is dropped or a screen-printing is applied to cure it, is also used.

The process of attaching the chip 11 and the lead frame 12 in FIG. 1 will be now explained by reference to FIG. 4 using the tape slice 31.

FIG. 4 is a diagram for explaining the processes of attaching the chip 11 to the lead frame 12 of the lead frame strip 40 using a conventional tape slice 31. The lead frame strip 40 is consisted of a number of lead frame units 40A, 40B and 40C. The tape slice 31 in FIG. 3 is attached to the lead frame units 40A, 40B and 40C, respectively. Then, the chip 11 is raised to the tape slice 31 and the chip 11 and the lead frame 12 are attached by means of curing and press.

The process of attaching the chip 21 and the substrate in FIG. 2 is same to the principle of attaching process explained by reference to FIG. 4.

As explained above, in the package in which the chip is attached to the lead frame as in the package of lead on chip type and the package in which the chip is attached to the substrate as in the chip scale package, there are various types of methods to attach the chip and the lead frame or the chip and the substrate. When using the three-layer structure tape, there are problems that the cutting tool is necessarily required, the manufacture of the lead frame is difficult regarding to the cutting burr, the productivity is lowered and void is generated between the lead and the lead. In case of dropping a coating solution after the three-layer structure tape is attached or in case of dropping adhesive later after a screen-printing is applied to cure it, there are problems that not only a lot of time can be consumed but also it is difficult to drop adhesive at an exact position. Also, there are problems that it is difficult to control its height in case of using elastomer and it is difficult to remove void in case of a nubbin type. Therefore, the conventional chip attachment process consumes a lot of time, this causing lower of the productivity and thereby lower of throughput of the product due to above problems.

SUMMARY OF THE INVENTION

It is therefore an object of the present invention to provide a tape for semiconductor package, method of manufacturing the same and method of manufacturing the package using the tape, which can reduce the cost and improve the productivity, by providing a tape for semiconductor package of a sheet type or a roll type in which a thermoplastic pattern matching to the lead frame or the portion to which the chip of the substrate is attached.

In order to accomplish the above object, the tape for a semiconductor package is characterized in that it comprises a base film to side of which a release film is applied; a plurality of alignment holes formed at the edge of said base film; and a thermoplastic pattern formed on said release film so that it can match to a lead frame or the portion to which a chip of a substrate is attached.

Further, in order to accomplish the above object, the method of manufacturing a tape for a semiconductor package is characterized in that it comprises the steps of providing a base film; applying a release film at one side of said base film; forming, at a given distance, a plurality of alignment holes along the edge of said base film; and forming a thermoplastic pattern on said release film so that it can match to a lead frame or the portion to which a chip of a substrate is attached.

Also, in order to accomplish the above object, the method of manufacturing a semiconductor package is characterized in that it comprises positioning a tape for a semiconductor package in which a thermoplastic pattern is formed, at the top of a lead frame strip; attaching said thermoplastic pattern to a lead frame of said lead frame strip by means of press process, and then removing said tape; raising said chip over said thermoplastic pattern and then attaching said chip to said lead frame by means of curing and press process; performing a wire bonding process; performing a molding and sealing process to protect said chip; and performing a form and singulation process to separate individual devices.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
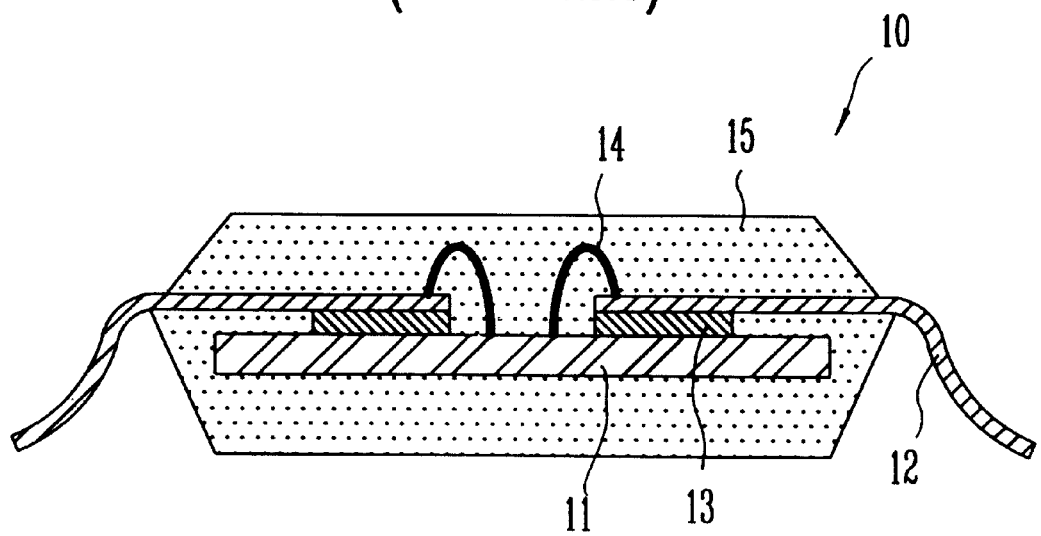
FIG. 1 is a sectional view of a conventional lead on chip type for attaching a chip to a lead frame.

The present invention will be described in detail by way of a preferred embodiment with reference to accompanying drawings, in which like reference numerals are used to identify the same or similar parts.

Below, one embodiment of the present invention will be explained in detail by reference to the accompanying drawings.

Figure 5A:
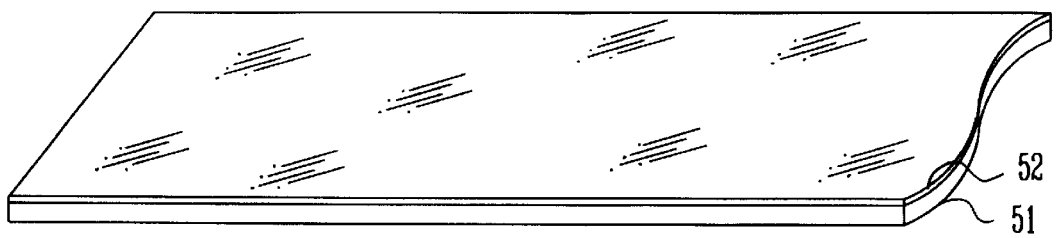
FIGS. 5A through 5C are schematic views for explaining a method of manufacturing a tape for a semiconductor package according to one embodiment of the present invention.
Figure 5B:
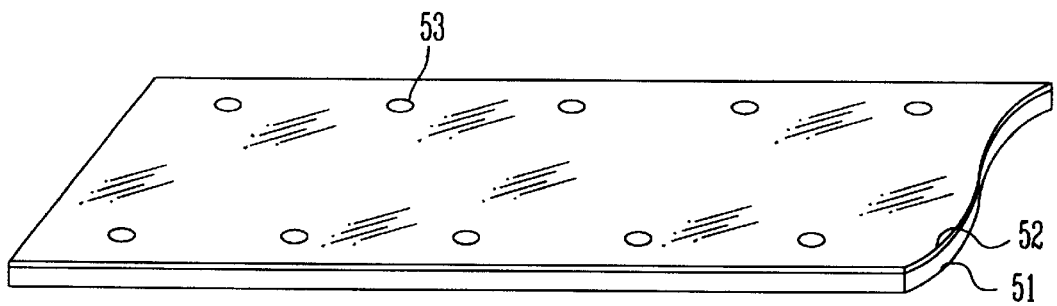
Figure 5C:
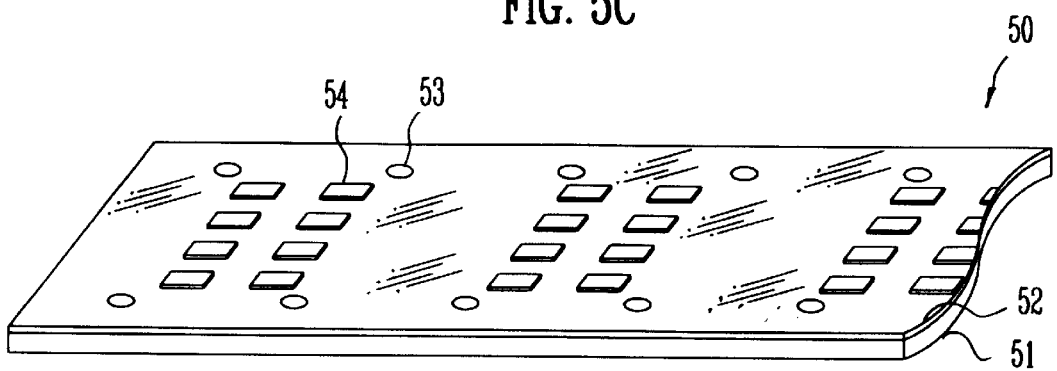

FIGS. 5A through 5C are schematic views for explaining a method of manufacturing a tape for a semiconductor package according to one embodiment of the present invention.

Referring now to FIG. 5A, a release film 52 is applied at one side of a base film 51 having a sheet type or a roll type.

Referring to FIG. 5B, for exact position alignment, a plurality of alignment holes 53 are formed at a given distance along the edge of the base film 51 by means of punching or etching process.

In the above, the process of applying the release film 52 and the process of forming the alignment holes 53 can be different in order.

Referring to FIG. 5C, by means of the screen printing process using the mask for the screen printing, the thermoplastic pattern layer 54 is formed on the release film 52 so that it can be aligned with the portion to which the chip of the lead frame is attached, thus completing a first tape 50 for the semiconductor package according to the present invention. During the screen-printing process, in order to exactly form the thermoplastic pattern 54, a plurality of alignment holes 53 are inserted into a fixing means (not shown) to fix the base film 51.

Figure 7A:
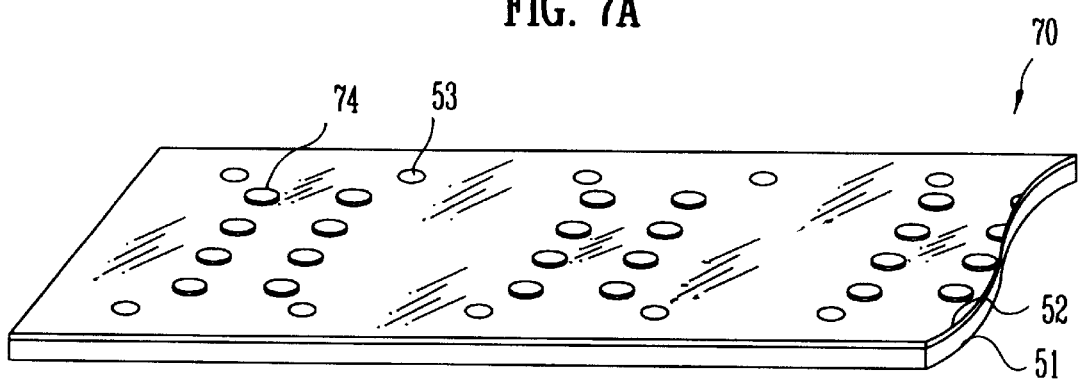
FIG. 7A is a schematic view of a tape for a semiconductor package having a nubbin type thermoplastic pattern according to the present invention.
Figure 7B:
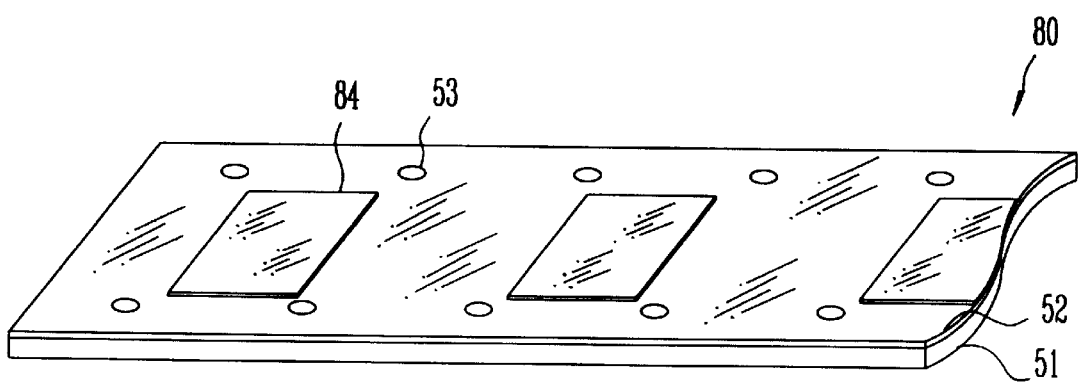
FIG. 7B is a schematic view of a tape for a semiconductor package having a sheet type thermoplastic pattern according to the present invention.

The first tape 50 manufactured by the above process is used in the package for attaching the chip 11 to the lead frame 12 as with the package of a lead on chip type 10 shown in FIG. 1, wherein the thermoplastic pattern 54 can be formed with various shapes depending on the type of the lead frame 12. That is, by means of the mask printing process using the mask, as shown in FIG. 7A, a second tape 70 for a semiconductor package according to the present invention, having a thermoplastic pattern 74 of a nubbin type, can be manufactured. Also, as shown in FIG. 7B, a third tape 80 for a semiconductor package according to the present invention, having a thermoplastic pattern 84 of a sheet type, can be manufactured. The second and third tapes 70 and 80 can be manufactured according to the same process of manufacturing the first tape 50, and can be also used in the package for attaching the chip 21 to the substrate 22 as in the chip scale package 20 shown in FIG. 2.

Now, the process of attaching the chip 11 and the lead frame 12 in FIG. 1 using the first tape 50 will be explained by reference to FIGS. 6A through 6C.

Figure 6A:
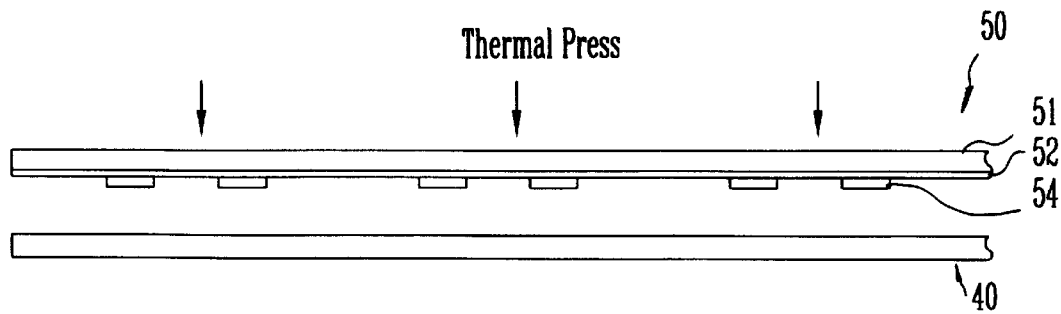
FIGS. 6A through 6C are diagrams for explaining the processes of attaching a chip to a lead frame of a lead frame strip using a tape for a semiconductor package of the present invention.
Figure 6B:
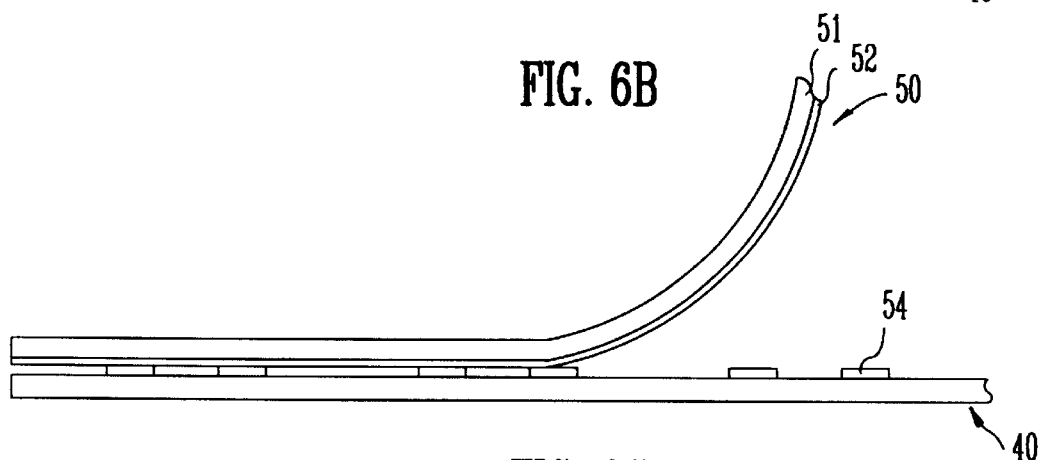
Figure 6C:
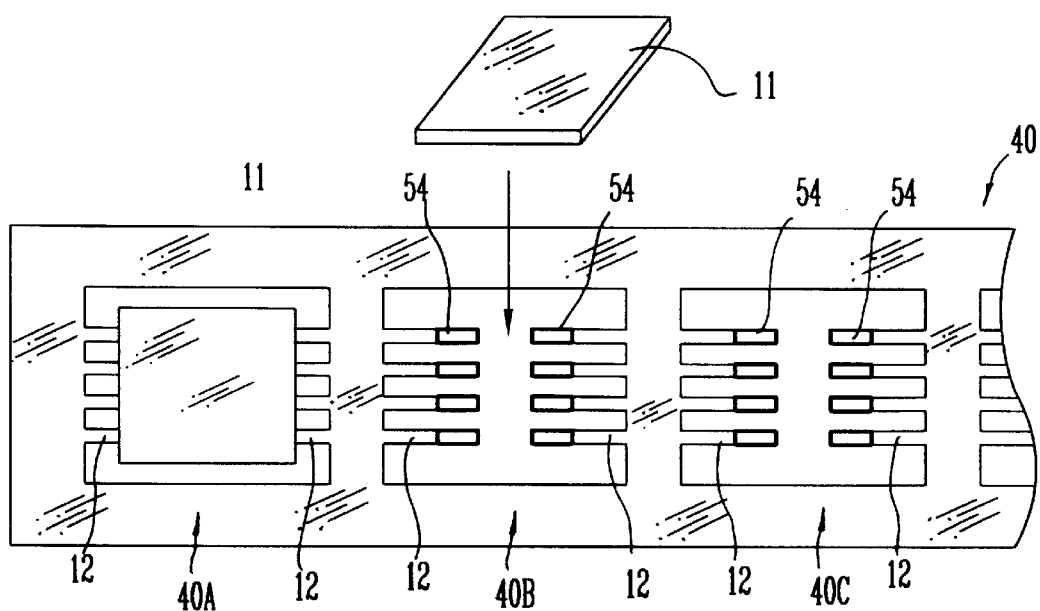

FIGS. 6A through 6C are diagrams for explaining the processes of attaching the chip 11 to the lead frame 12 of the lead frame strip 40 using the first tape 50 for the semiconductor package according to the present invention.

Referring now to FIG. 6A, a lead frame strip 40 consisted of a plurality of lead frame units 40A, 40B and 40C is provided, and the first tape 50 is positioned on the top of the lead frame strip 40. Then, a thermal press process is implemented. The alignment hole 53 for exactly aligning the first tape 50 and the lead frame strip 40 is provided.

Referring to FIG. 6B, the thermoplastic pattern 54 formed at the first tape 50 is attached to the lead frame 12 by means of thermal press process. Thereafter, the base film 51 is removed together with the release film 52.

Referring to FIG. 6C, after the chip 11 is raised over the thermoplastic pattern 54 attached to the lead frame 12 of the respective lead frame units 40A, 40B and 40C, the chip 11 and the lead frame 12 are attached by means of curing and press process.

Figure 2:
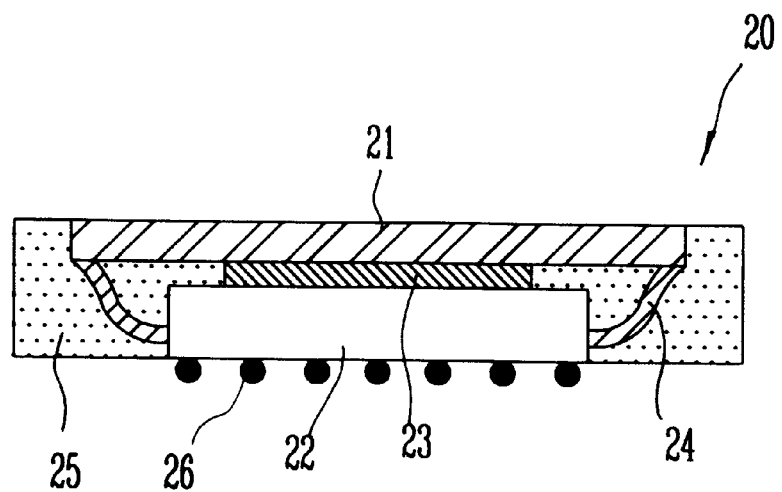
FIG. 2 is a sectional view of a conventional chip scale package for attaching a chip to a substrate.
Figure 3:
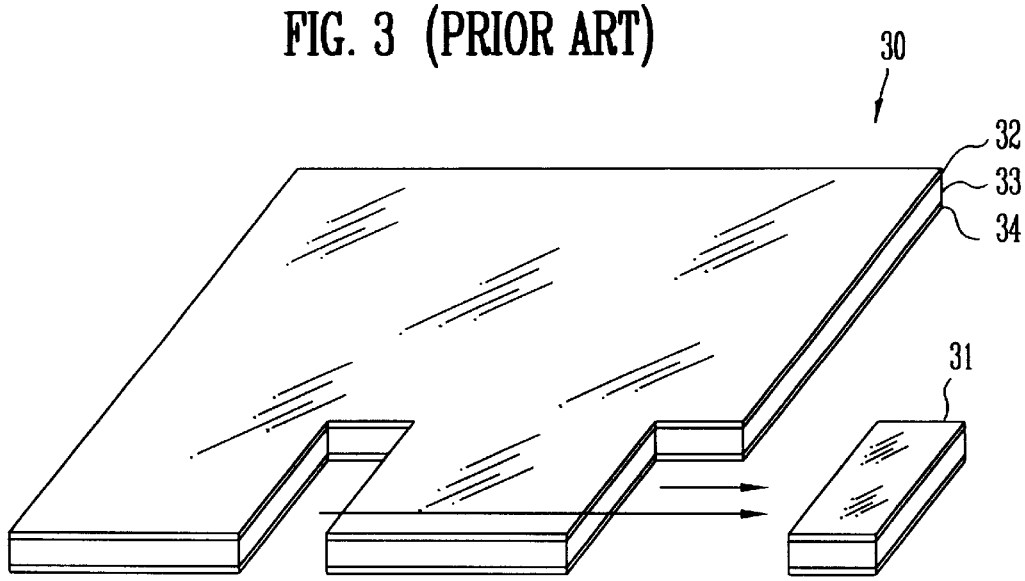
FIG. 3 is a schematic view of a conventional three-layer structure.
Figure 4:
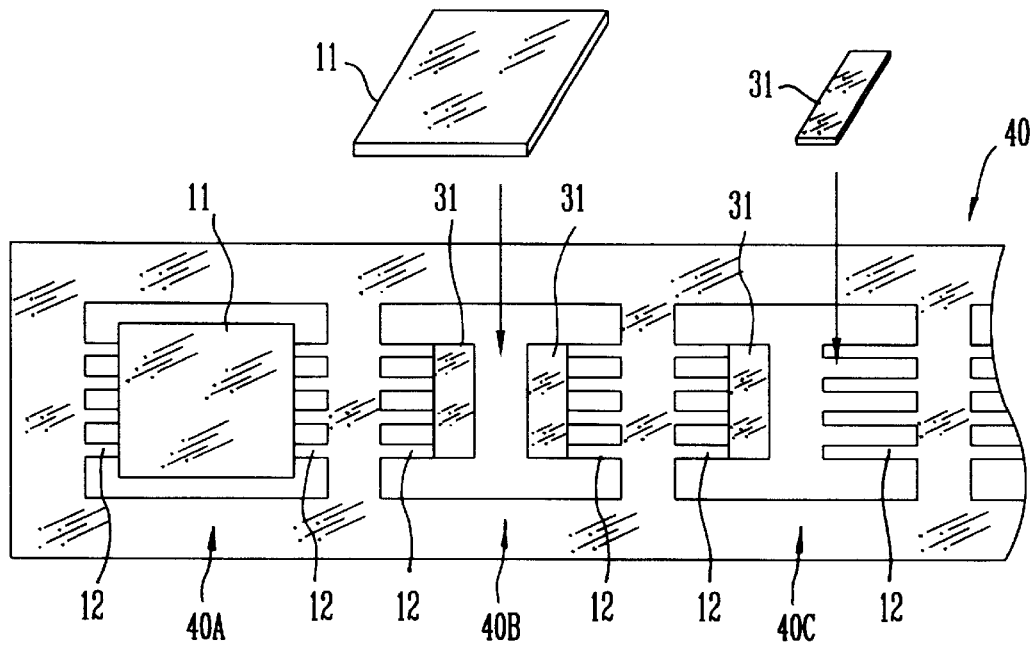
FIG. 4 is a diagram for explaining the processes of attaching a chip to a lead frame of a lead frame strip using a conventional three-layer structure.

As shown in FIG. 2, the chip attachment process can be performed to the chip scale package 20 for attaching the chip 21 and the substrate 22 using the second and third tapes 70 and 80 shown in FIG. 7A and FIG. 7B, respectively, as with the process explained by reference to FIGS. 6A through 6C.

After the above chip attachment process, a wire/lead bonding process for electrically connecting the chip 11 and the lead frame 12 or the chip 21 and the substrate 22, and a molding and sealing process for protecting the chips 11 and 12 from various damage factors are sequentially performed to complete all the assembly process. The package 10 of a lead on chip type is manufactured by sequentially performing mechanical/chemical deflash process, a tin plating process, a trim process, a form/singulation process, a pretest process, a burn-in test process, a post test process, etc., so that individual devices can be separated from the lead frame strip consisted of lead frame units and their lead shapes can be formed into a prescribed shape, thus functioning as a complete integrated circuit (IC), after the above assembly process.

Meanwhile, the first, second and third tapes 50, 70 and 80 illustrated in the present invention are several embodiments for explaining the tape for a semiconductor package and method of manufacturing the same. Thus, it is not designed that the present invention is limited to these embodiments and covers all the tape for a semiconductor package, method of manufacturing the same and method of manufacturing the package using the tape without departing the scope and spirit of the accompanying claims of the present invention.

As explained above, according to the present invention, it includes a chip attachment process using a tape for a semiconductor package of a sheet type or a roll type in which a thermoplastic pattern matching to the lead frame or the portion to which the chip of the substrate is attached is formed, so that it can simplify the process compared to the conventional chip attachment process using a three-layer structure tape, elastomer and adhesive etc., prevent void between the leads from generating, reduce the cost without the necessity of costly equipment, and improve the productivity.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a tape for a semiconductor package, comprising the steps of:

providing a base film;

applying a release film at one side of said base film;

forming, at a given distance, a plurality of alignment holes along the edge of said base film; and forming a thermoplastic pattern on said release film, said thermoplastic pattern comprising a plurality of portions, each one of said plurality of portions matching one of a plurality of leads of a lead frame.

2. The method of manufacturing a tape for a semiconductor package according to claim 1, wherein said thermoplastic pattern is formed by a screen printing process using a mask for screen printing.

3. A method of manufacturing a semiconductor package, comprising the steps of:

providing a tape having a thermoplastic pattern comprising a plurality of portions, each one of said plurality of portions matching one of a plurality of leads of a lead frame strip;

positioning said tape at the top of said lead frame strip;

attaching said thermoplastic pattern to a lead frame of said lead frame strip by means of press process, and then removing said tape;

raising said chip over said thermoplastic pattern and then attaching said chip to said lead frame by means of curing and press process;

performing a wire bonding process;

performing a molding and sealing process to protect said chip; and performing a form and singulation process to separate individual devices.

* * * * *